US009620579B2

(12) United States Patent
Kim et al.

(10) Patent No.: US 9,620,579 B2
(45) Date of Patent: Apr. 11, 2017

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventors: Nayoung Kim, Yongin (KR); Jungbae Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 36 days.

(21) Appl. No.: 14/835,483

(22) Filed: Aug. 25, 2015

(65) Prior Publication Data

US 2016/0190224 A1 Jun. 30, 2016

(30) Foreign Application Priority Data

Dec. 26, 2014 (KR) .................. 10-2014-0191122

(51) Int. Cl.
*H01L 29/04* (2006.01)
*H01L 29/10* (2006.01)
(Continued)

(52) U.S. Cl.
CPC ...... *H01L 27/3276* (2013.01); *H01L 27/3248* (2013.01); *H01L 27/3258* (2013.01);
(Continued)

(58) Field of Classification Search
CPC ............ H01L 27/1214; H01L 21/768
(Continued)

(56) References Cited

U.S. PATENT DOCUMENTS 5,482,870 A * 1/1996 Inoue ............... H01L 29/78621
257/E21.413
6,055,034 A * 4/2000 Zhang ................. G02F 1/1339
257/72
(Continued)

FOREIGN PATENT DOCUMENTS

KR 10-2005-0110550 A 11/2005
KR 10-2008-0025220 A 3/2008
(Continued)

*Primary Examiner* — Lex Malsawma
*Assistant Examiner* — Eric Jones
(74) *Attorney, Agent, or Firm* — Knobbe Martens Olson & Bear LLP (57) ABSTRACT

An organic light-emitting display apparatus includes a substrate; an active layer; a gate electrode, source and drain electrodes; a first insulating layer disposed between the active layer and the gate electrode; a second insulating layer disposed between the gate electrode and the source and drain electrodes; a third insulating layer disposed over the source and drain electrodes; conductive layers disposed over the third insulating layer and electrically connected to the source and drain electrodes through the third insulating layer; a first line disposed over the second insulating layer and formed of the same material as the source and drain electrodes; a second line overlapping the first line, disposed over the third insulating layer, and formed of the same material as the conductive layer; a fourth insulating layer disposed over the third insulating layer to cover the conductive layer; and an organic light-emitting diode disposed over the fourth insulating layer.

20 Claims, 9 Drawing Sheets (51) Int. Cl.
  *H01L 31/00* (2006.01)
  *H01L 27/32* (2006.01)
  *H01L 29/417* (2006.01)
  *H01L 29/66* (2006.01)
  *H01L 29/786* (2006.01)

(52) U.S. Cl.
  CPC ...... *H01L 27/3262* (2013.01); *H01L 27/3265* (2013.01); *H01L 29/41733* (2013.01); *H01L 29/66757* (2013.01); *H01L 29/78675* (2013.01); *H01L 2227/323* (2013.01)

(58) Field of Classification Search
  USPC .................................. 257/40, 59; 438/22, 29
  See application file for complete search history.

(56) References Cited

U.S. PATENT DOCUMENTS

| | | | | |
|---|---|---|---|---|
| 6,359,606 B1* | 3/2002 | Yudasaka | ............ | H01L 27/3246 313/483 |
| 6,373,453 B1* | 4/2002 | Yudasaka | ............ | G09G 3/3225 315/169.3 |
| 7,642,587 B2* | 1/2010 | Kim | ............ | H01L 27/3265 257/296 |
| 7,911,131 B2* | 3/2011 | Kim | ............ | H01L 51/5281 257/59 |
| 7,919,918 B2* | 4/2011 | Kim | ............ | H01L 27/3244 313/506 |
| 8,310,475 B2* | 11/2012 | Ozawa | ............ | G09G 3/30 345/204 |
| 8,415,676 B2* | 4/2013 | Kim | ............ | H01L 27/3276 257/432 |
| 8,803,167 B2* | 8/2014 | Koh | ............ | H01L 27/3244 257/40 |
| 2002/0158835 A1* | 10/2002 | Kobayashi | ............ | H01L 27/3244 345/100 |
| 2003/0168992 A1* | 9/2003 | Noguchi | ............ | H01L 27/3276 315/169.3 |
| 2004/0056591 A1* | 3/2004 | Koo | ............ | H01L 27/3244 313/506 |
| 2005/0116232 A1* | 6/2005 | Kim | ............ | H01L 27/1288 257/72 |
| 2005/0121677 A1* | 6/2005 | Kim | ............ | H01L 28/40 257/72 |
| 2005/0275038 A1* | 12/2005 | Shih | ............ | H01L 29/78633 257/382 |
| 2008/0067505 A1 | 3/2008 | Lee et al. | | |
| 2009/0302332 A1* | 12/2009 | Kang | ............ | H01L 27/1288 257/88 |
| 2011/0164019 A1* | 7/2011 | Son | ............ | H01L 27/3276 345/211 |
| 2013/0062602 A1* | 3/2013 | Jeon | ............ | H01L 29/7869 257/43 |
| 2013/0099218 A1* | 4/2013 | Lee | ............ | H01L 51/5203 257/40 |
| 2013/0207117 A1 | 8/2013 | An et al. | | |
| 2014/0034923 A1 | 2/2014 | Kim et al. | | |
| 2014/0217410 A1* | 8/2014 | Hsu | ............ | H01L 21/845 257/59 |
| 2015/0144908 A1* | 5/2015 | Yoon | ............ | H01L 27/3216 257/40 |

FOREIGN PATENT DOCUMENTS

| | | |
|---|---|---|
| KR | 10-2013-0092229 A | 8/2013 |
| KR | 10-2013-0097310 A | 9/2013 |
| KR | 10-2014-0018623 A | 2/2014 |

* cited by examiner

ORGANIC LIGHT-EMITTING DISPLAY APPARATUS AND METHOD OF MANUFACTURING THE SAME

RELATED APPLICATION

This application claims the benefit of Korean Patent Application No. 10-2014-0191122, filed on Dec. 26, 2014, in the Korean Intellectual Property Office, the disclosure of which is incorporated herein in its entirety by reference.

BACKGROUND

1. Field

One or more embodiments relate to an organic light-emitting display apparatus and methods of manufacturing the same.

2. Description of the Related Art

An organic light-emitting display apparatus is a self-emission display apparatus that includes a hole injection electrode, an electron injection electrode, and an organic emission layer disposed between the hole injection electrode and the electron injection electrode, and holes provided from the hole injection electrode and electrons provided from the electron injection electrode recombine and disappear in the organic emission layer, thereby generating light. The organic light-emitting display apparatus is being spotlighted as a next-generation display device due to its various advantages, such as low power consumption, high brightness, and high response speed.

SUMMARY

One or more embodiments include an organic light-emitting display apparatus that may stably implement a high-resolution and large-sized panel by reducing resistance of a line layer.

Additional aspects will be set forth in part in the description which follows and, in part, will be apparent from the description, or may be learned by practice of the presented embodiments.

One aspect of the invention provides an organic light-emitting display apparatus, which may comprise: a substrate comprising a major surface; an active layer, a gate electrode, and source and drain electrodes formed over the substrate for providing a thin film transistor; a first insulating layer disposed over the substrate; a second insulating layer disposed over the first insulating layer; a third insulating layer disposed over the second insulating layer; a fourth insulating layer disposed over the third insulating layer; the active layer disposed between the substrate and the first insulating layer; the gate electrode disposed between the first insulating layer and the second insulating layer; the source and drain electrode disposed between the second insulating layer and the third insulating layer; conductive layers disposed between the third insulating layer the fourth insulating layer, the conductive layers being electrically connected to the source and drain electrodes through the third insulating layer, respectively; a first line disposed between the second insulating layer and the third insulating layer, the first line being formed of the same material as the source and drain electrodes; a second line overlapping at least a portion of the first line when viewed in a viewing direction perpendicular to the major surface, the second line being disposed between the third insulating layer and the fourth insulating layer such that the second line is covered by the fourth insulating layer, wherein the second line is formed of the same material as the conductive layers; and an organic light-emitting diode disposed over the fourth insulating layer.

In the foregoing apparatus, the first line may be a data line that is electrically connected to one of the source and drain electrodes, and wherein the second line may be a scan line that is electrically connected to one of the conductive layers, the second line having a thickness greater than the first line. The apparatus may further comprise a capacitor that comprises a lower electrode disposed between the first insulating layer and the second insulating layer and an upper electrode disposed between the second insulating layer and the third insulating layer, wherein the second insulating layer may comprise a portion disposed between the lower electrode and the upper electrode. The apparatus may further comprise a portion disposed between the active layer and the substrate. The third insulating layer may comprise at least one selected from $SiN_x$, $SiO_2$, $ZrO_2$, $TiO_2$, $Ta_2O_5$, and $Al_2O_3$.

Still in the foregoing apparatus, the fourth insulating layer may comprise an organic insulating material. A thickness of the fourth insulating layer may be greater than that of the third insulating layer. The source and drain electrodes may be electrically connected to the active layer via the conductive layers, respectively. The conductive layers may be electrically connected to the active layer through holes formed in the first insulating layer, the second insulating layer, and the third insulating layer, respectively. The source and drain electrodes may be electrically connected to the active layer through holes formed in the first insulating layer and the second insulating layer, respectively. The organic light-emitting diode may comprise a pixel electrode, an intermediate layer disposed over the pixel electrode and comprising an organic light emission layer, and an opposite electrode disposed over the intermediate layer. The pixel electrode may be electrically connected to one of the source and drain electrodes via one of the conductive layers.

Another aspect of the invention provides a method of manufacturing an organic light-emitting display apparatus, which may comprise: forming a semiconductor layer over a substrate and patterning the semiconductor layer, thereby forming an active layer; forming a first insulating layer over the substrate and the active layer; forming a first metal layer over the first insulating layer and patterning the first metal layer, thereby forming a gate electrode over the first insulating layer; forming a second insulating layer over the first insulating layer and the gate electrode; forming a second metal layer over the second insulating layer and patterning the second metal layer, thereby forming a first line and source and drain electrodes; forming a third insulating layer over the second insulating layer, the first line and the source and drain electrodes; forming first holes through the first insulating layer, the second insulating layer and the third insulating layer, and second holes through the third insulating layer, wherein the first holes expose source and drain regions of the active layer, respectively, and the second holes expose the source and drain electrodes, respectively; forming a third metal layer over the third insulating layer and patterning the third metal layer, thereby forming a second line and conductive layers, the second line having a thickness greater than the first line; forming a fourth insulating layer over the third insulating layer, the second line and the conductive layers; forming a third hole through the fourth insulating layer, wherein the third hole exposes at least a portion of one of the conductive layers; and forming a fourth metal layer over the fourth insulating layer and patterning the fourth metal layer, thereby forming a pixel electrode.

Still another aspect of the invention provides a method of manufacturing an organic light-emitting display apparatus, which may comprise: forming a semiconductor layer over a substrate and patterning the semiconductor layer, thereby forming an active layer; forming a first insulating layer over the substrate and the active layer; forming a first metal layer over the first insulating layer and patterning the first metal layer, thereby forming a gate electrode over the first insulating layer; forming a second insulating layer over the first insulating layer and the gate electrode; forming first holes through the first insulating layer and the second insulating layer, wherein the first holes exposes source and drain regions of the active layer, respectively; forming a second metal layer over the second insulating layer and patterning the second metal layer, thereby forming a first line and source and drain electrodes; forming a third insulating layer over the second insulating layer, the first line and the source and drain electrodes; forming second holes through the third insulating layer, wherein the second holes expose the source and drain electrodes, respectively; forming a third metal layer over the third insulating layer and patterning the third metal layer, thereby forming a second line and conductive layers, the second line having a thickness greater than the first line; forming a fourth insulating layer over the third insulating layer, the second line and the conductive layers; forming a third hole through the fourth insulating layer, wherein the third hole exposes at least a portion of one of the conductive layers; and forming a fourth metal layer over the fourth insulating layer and patterning the fourth metal layer, thereby forming a pixel electrode.

In each of the foregoing methods, the method may further comprise, after forming the gate electrode: doping the source and drain regions of the active layer with an ion impurity. A lower capacitor electrode may be formed when patterning the first metal layer, and wherein an upper capacitor electrode may be formed when patterning the second metal layer. The method may further comprise, after forming the pixel electrode: forming an intermediate layer comprising an organic light emission layer over the pixel electrode; and forming an opposite electrode overlapping the pixel electrode and covering the intermediate layer.

According to one or more embodiments, an organic light-emitting display apparatus may include: a substrate; a thin film transistor (TFT) disposed on the substrate and comprising an active layer, a gate electrode, source and drain electrodes, a first insulating layer disposed between the active layer and the source and drain electrodes, a second insulating layer disposed between the gate electrode and the source and drain electrodes, a third insulating layer disposed on the source and drain electrodes, and a conductive layer disposed on the third insulating layer and electrically connected to the source and drain electrodes through holes formed in the third insulating layer; a first line disposed on the second insulating layer and formed of the same material as the source and drain electrodes; a second line overlapping at least a portion of the first line, disposed on the third insulating layer, and formed of the same material as the conductive layer; a fourth insulating layer disposed on the third insulating layer and covering the conductive layer; and an organic light-emitting diode disposed on the fourth insulating layer.

In an embodiment, the first line may be a data line that is electrically connected to one of the source and drain electrodes, and the second line may be a scan line that is electrically connected to the second line.

In an embodiment, the organic light-emitting display apparatus may further include a capacitor that includes a lower electrode disposed on the same layer as the gate electrode and an upper electrode disposed on the same layer as the source and drain electrodes, wherein the second insulating layer may be disposed between the lower electrode and the upper electrode.

In an embodiment, the first insulating layer may be disposed both on the active layer and below the lower electrode.

In an embodiment, the third insulating layer may include at least one selected from $SiN_x$, $SiO_2$, $ZrO_2$, $TiO_2$, $Ta_2O_5$, and $Al_2O_3$.

In an embodiment, the fourth insulating layer may include an organic insulating material.

In an embodiment, a thickness of the fourth insulating layer may be greater than that of the third insulating layer.

In an embodiment, the source and drain electrodes may be electrically connected to the active layer via the conductive layer.

In an embodiment, the conductive layer may be electrically connected to the active layer through a hole formed in the first insulating layer, the second insulating layer, and the third insulating layer.

In an embodiment, the source and drain electrodes may be electrically connected to the active layer through holes formed in the first insulating layer and the second insulating layer.

In an embodiment, the organic light-emitting diode may include a pixel electrode, an intermediate layer disposed on the pixel electrode and including an organic emission layer, and an opposite electrode disposed on the intermediate layer.

In an embodiment, the pixel electrode may be electrically connected to one of the source and drain electrodes via the conductive layer.

According to one or more embodiments, a method of manufacturing an organic light-emitting display apparatus includes: performing a first step for forming an active material of a thin film transistor by patterning a semiconductor layer after forming the semiconductor layer on a substrate; performing a second step for forming a first insulating layer on the resultant structure of the first step and forming a gate electrode of the thin film transistor by patterning a first metal layer after forming the first metal layer on the first insulating layer; performing a third step for forming a second insulating layer on the resultant structure of the second step and for forming a first line and source and drain electrodes of the thin film transistor by patterning a second metal layer after forming the second metal layer on the second insulating layer; performing a fourth step for forming a third insulating layer on the resultant structure of the third step and for forming a first opening simultaneously formed on the first insulating layer, the second insulating layer and the third insulating layer and a second opening on the third insulating layer, wherein the first opening exposes source and drain regions of the active layer and the second opening exposes the source and drain electrodes of the thin film transistor; performing a fifth step for forming a third metal layer on the resultant structure of the fourth step and for forming a second line and a conductive layer of the thin film transistor by patterning the third metal layer; performing a sixth step for forming a fourth insulating layer on the resultant structure of the fifth step and for forming a third opening on the fourth insulating layer, wherein the third opening exposes at least a portion of the conductive layer; and performing a seventh step for forming a fourth metal layer on the product of the sixth step and for forming a pixel electrode by patterning the fourth metal layer.

In an embodiment, after performing the second step, the source and drain regions of the active layer may be doped with an ion impurity.

In an embodiment, the second step may include a process for forming a lower electrode of a capacitor by patterning the first metal layer, and the third step may include a process for forming an upper electrode of the capacitor by patterning the second metal layer.

In an embodiment, after performing the seventh step, an intermediate layer including an organic emission layer may be formed on the pixel electrode, and an opposite electrode may be disposed facing the pixel electrode to cover the intermediate layer.

According to one or more embodiments, a method of manufacturing an organic light-emitting display apparatus includes: performing a first step for forming an active material of a thin film transistor by patterning a semiconductor layer after forming the semiconductor layer on a substrate; performing a second step for forming a first insulating layer on the resultant structure of the first step and for forming a gate electrode of a thin film transistor by patterning a first metal layer after forming the first metal layer on the first insulating layer; performing a third step for forming a second insulating layer on the resultant structure of the second step and for forming a first opening simultaneously on the first insulating layer and the second insulating layer, wherein the first opening exposes source and drain regions of the active layer; performing a fourth step for forming a second metal layer on the resultant structure of the third step and for forming a first line and source and drain electrodes of the thin film transistor by patterning the second metal layer; performing a fifth step for forming a third insulating layer on the resultant structure of the fourth step and for forming a second opening on the third insulating layer, wherein the second opening exposes the source and drain electrodes of the thin film transistor; performing a sixth step for forming a third metal layer on the resultant structure of the fifth step and for forming a second line and a conductive layer of the thin film transistor by patterning the third metal layer; performing a seventh step for forming a fourth insulating layer on the resultant structure of the sixth step and for forming a third opening on the fourth insulating layer, wherein the third opening exposes at least a portion of the conductive layer; and performing a eighth step for forming a fourth metal layer on the resultant structure of the seventh step and for forming a pixel electrode by patterning the fourth metal layer.

In an embodiment, after performing the second step, the source and drain regions of the active layer may be doped with an ion impurity.

In an embodiment, the second step may include a process for forming a lower electrode of a capacitor by patterning the first metal layer, and the fourth step may include a process for forming an upper electrode of the capacitor by patterning the second metal layer.

In an embodiment, after performing the eighth step, an intermediate layer including an organic emission layer may be formed on the pixel electrode, and an opposite electrode may be disposed facing the pixel electrode to cover the intermediate layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements through. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of the related art are omitted when it is deemed that they may unnecessarily obscure the essence of the invention.

While such terms as "first," "second," etc., may be used to describe various components, such components must not be limited to the above terms. The above terms are used only to distinguish one component from another.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Figure 1:
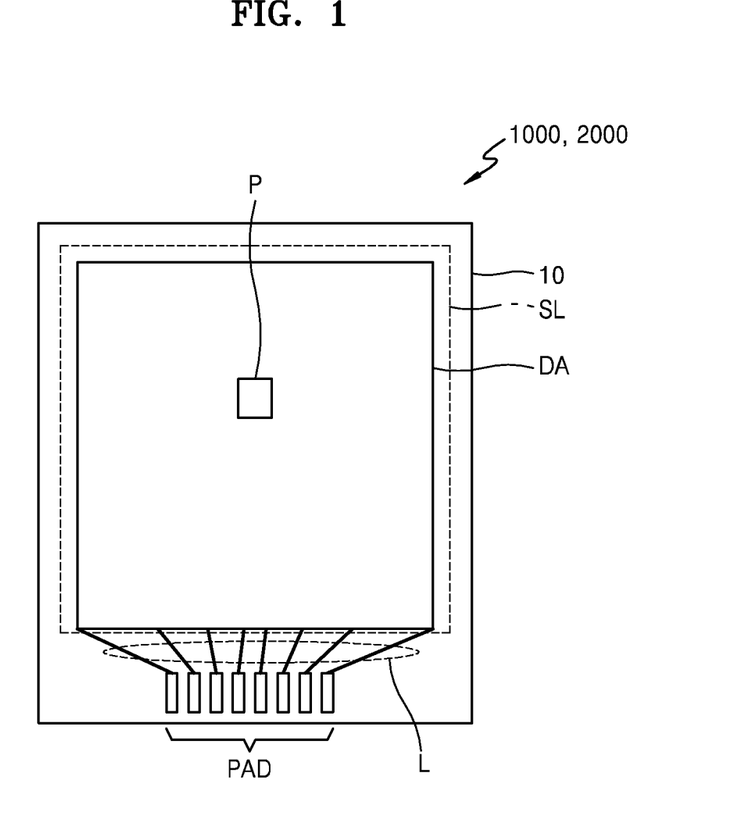
FIG. 1 is a schematic plan view of an organic light-emitting display apparatus according to an embodiment.
Figure 2:
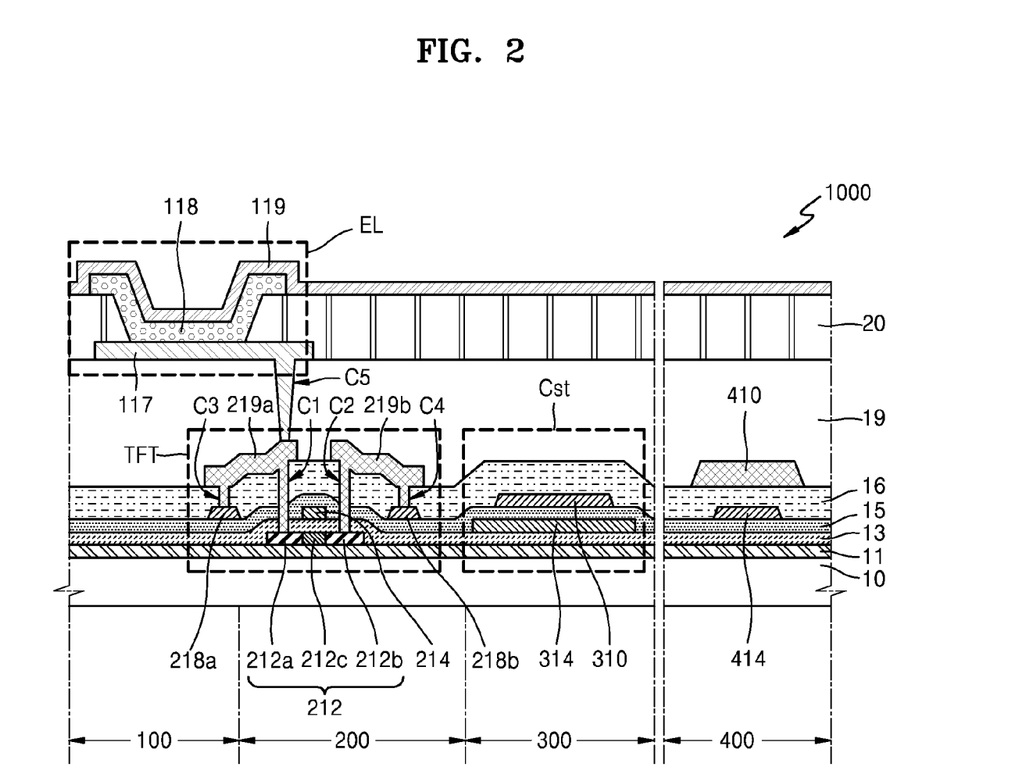
FIG. 2 is a schematic cross-sectional view showing a portion of a pixel and a line unit included in an organic light-emitting display apparatus according to an embodiment.

FIG. 1 is a schematic plan view of an organic light-emitting display apparatus according to an embodiment, and FIG. 2 is a schematic cross-sectional view showing a portion of a pixel and a line unit included in the organic light-emitting display apparatus according to an embodiment.

Referring to FIG. 1, the organic light-emitting display apparatus according to an embodiment includes a substrate 10 on which a display area DA including a plurality of pixels P for displaying an image and a line unit L are disposed. The line unit L includes a plurality of lines that are electrically connected to the display area DA and extended toward the pad unit PAD. The display area DA is formed inside a sealing line SL and includes an encapsulation member for encapsulating the display area DA along the sealing line SL.

Referring to FIG. 2, the organic light-emitting display apparatus 1000 includes a substrate 10. An array of pixels P is formed in an emission area 100. In embodiments, each pixel may include at least one organic electro-luminescent element EL, a thin film transistor TFT area 200 including at least one thin film transistor TFT, and a storage area 300 including at least one capacitor Cst. On the substrate 10, a line unit 400 including a plurality of lines connected to the plurality of pixels is disposed.

Hereinafter, each of the thin film transistor TFT area 200, the storage area 300, the emission area 100, and the line unit 400 will be sequentially described in detail.

The thin film transistor TFT area 200 includes at least one thin film transistor TFT, such as a driving thin film transistor dTFT or a switching thin film transistor sTFT. The thin film transistor TFT includes an active layer 212, a gate electrode 214, and source and drain electrodes 218a and 218b. A first insulating layer 13 is formed between the active layer 212 and the gate electrode 214. A second insulating layer 15 is formed between the gate electrode 214 and the source and drain electrodes 218a and 218b. A third insulating layer 16, which is an interlayer insulating film, is formed on the source and drain electrodes 218a and 218b. In addition, conductive layers 219 is formed on the third insulating layer 16, the conductive layers 219 being electrically connected to the source and drain electrodes 218a and 218 through holes formed in the third insulating layer 16.

Meanwhile, source and drain regions 212a and 212b that are heavily doped with impurities are formed on both edges of the active layer 212. The source and drain regions 212a and 212b are electrically connected to the source and drain electrodes 218a and 218b, respectively, by using interconnection portions, i.e., regions 219a and 219b of the conductive layer. Alternatively, the source and drain regions 212a and 212b may be directly electrically connected to the source and drain electrodes 218a and 218b, respectively.

In the cross-sectional view of FIG. 2, for convenience of description, only a driving thin film transistor dTFT that is electrically connected to the electro-luminescent element EL for supplying current is shown. Further, a switching thin film transistor sTFT may also have the same structure as the driving thin film transistor dTFT.

The storage area 300 includes at least one capacitor Cst. The capacitor Cst stores a signal that is applied to the driving thin film transistor dTFT, even after the switching thin film transistor sTFT turns off. The capacitor Cst includes two electrodes, i.e., a lower electrode 314 and an upper electrode 310, and the second insulating layer 15 is formed as a dielectric layer between the two electrodes. The lower electrode 314 is formed on the first insulating layer 13 in the same manner as the gate electrode 214, and the upper electrode 310 is formed on the second insulating layer 15 in the same manner as the source and drain electrodes 218a and 218b. In addition, since the upper electrode 310 is covered by the third insulating layer 16 and a fourth insulating layer 19, during an etching process of a pixel electrode 117 using an etchant including a silver (Ag) ion, the upper electrode 310 is not exposed to the etchant. Accordingly, the organic light-emitting display apparatus 1000 may be free from faulty particles that are caused by re-deposition of Ag.

The lower electrode 314 may be formed of the same material as the gate electrode 214, and the upper electrode 310 may be formed of the same material as the source and drain electrodes 218a and 218b. Here, the upper electrode 310 or the lower electrode 314 is connected to a power supply line, to thereby receive a power supply voltage from the power supply line.

The emission area 100 includes at least one electroluminescent element EL. The electro-luminescent element EL includes a pixel electrode 117 that is electrically connected to one of the source and drain electrodes 218a or 218b of the thin film transistor TFT, an opposite electrode 119 that is disposed facing the pixel electrode 117, and an intermediate layer 118 that is formed between the pixel electrode 117 and the opposite electrode 119. The pixel electrode 117 is formed on the first insulating layer 13, the second insulating layer 15, the third insulating layer 16, and the fourth insulating layer 19, the first through fourth insulating layers being sequentially formed on the substrate 10. In the case of a bottom emission type display apparatus in which light is emitted toward the substrate 10, the pixel electrode 117 may be a light transmission electrode and the opposite electrode 119 may be a light reflecting electrode, but the embodiment is not limited thereto. In the case of a top emission type display apparatus in which light is emitted in a direction away from the substrate 10, the pixel electrode 117 may be a light reflection electrode including a semi-transmission metal layer and the opposite electrode 119 may be a light transmission electrode. As a combination of a bottom emission type display apparatus and a top emission type display apparatuses, the organic light-emitting display apparatus 1000 may be a dual emission type display apparatus in which light is emitted bi-directionally. In embodiments, the opposite electrode 119 may be a common electrode which covers the display area and corresponds to the plurality of pixels.

The line area 400 includes at least one line. Here, the line is electrically coupled with the thin film transistor TFT, the capacitor Cst, the organic electro-luminescent element EL, or a driver IC included in the organic light-emitting display apparatus 1000, and in this regard, the line is a generic term for all structures for providing current, voltage, or signals. In addition to being a scan line, a data line, and a power supply line, the line may be any of a variety of signal lines, such as a clock line for delivering signals (e.g., CLK, CLKB, SP, etc.) required to drive various driver ICs, or various signal lines including an initial signal input line. Meanwhile, the line may be positioned in the display area DA in which a pixel array is included to display an image, or may be positioned in a non-display area in which various types of pads are arranged to connect an external driver IC. For example, lines positioned in the non-display area may be positioned specifically in a fan-out area that is placed between the display area DA and the pad unit PAD. Alternatively, lines positioned in the non-display area may be positioned in different layers according to a connective relationship between a diode and a driver IC.

Referring to FIG. 2, a first line 414 is formed on the second insulating layer 15 in the same manner as the source and drain electrodes 218a and 218b, and a second line 410 is formed on the third insulating layer 16 in the same manner as the conductive layers 219. The first line 414 may be formed of the same material as the source and drain electrodes 218a and 218b, and the second line 410 may be formed of the same material as the conductive layers 219. The first line 414 and the second line 410 may at least partially overlap when viewed in a viewing direction perpendicular to a major surface of the substrate.

In an embodiment, the first line 414 may be a data line that is electrically connected to one of the source and drain electrodes 218a and 218b, and the second line 410 may be a scan line that is electrically connected to the conductive layers 219a, 219b.

In the case of the scan line, the line may have a high load loss if a thickness of a metal layer forming the line is small, and it is more likely to occur in a high-resolution and large-sized panel. If the scan line still has a high load loss and the resistance thereof is not reduced, there may be some undesirable effects, such as improper initialization or a failure in data input due to a scan thin film transistor TFT that does not appropriately operate. Accordingly, various attempts have been made to reduce the load loss on the scan line, and one example is a segmentation driving method that decreases rise time or fall time by reducing the load loss on the scan line in a design or operation. However, the ability of such a method in a design or operation to reduce the load loss on the scan line is limited, as long as the display apparatus is not structurally optimized. Eventually, to reduce the load of the scan line, the resistance of the scan line needs to be reduced as much as possible.

For example, to reduce the resistance of the scan line, the thickness of the metal layer forming the scan line may be increased.

As shown in FIG. 2, the second line 410 that is used as the scan line is formed between the fourth insulating layer 19 and the third insulating layer 16. Here, the fourth insulating layer 19 may be formed of an organic material, and may be formed thicker than other insulating layers 13, 15, and 16 that are formed of an inorganic material and disposed below the fourth insulating layer 19. In this regard, the fourth insulating layer 19 covering the second line 410 is thick enough to allow an increase in a thickness of the second line 410. In embodiments, an organic layer, such as the fourth insulating layer 19, may be sufficiently planarized without influencing properties of layers that are disposed thick below the fourth insulating layer 19. In this regard, the thickness of the second line 410, which is disposed below the fourth insulating layer 19, may be possibly increased to some extent.

In an embodiment, a line layer that is used as the scan line may be disposed below the first insulating layer 13, the second insulating layer 15, or the third insulating layer 16, the insulating layers being formed of an inorganic material. If the line layer is disposed below the third insulating layer 16 which serves as an interlayer insulation film, the third insulating layer 16 may be formed thicker than the first insulating layer 13 and the second insulating layer 15. However, since the third insulating layer 16 is limited to an inorganic layer, a thickness of the line layer that is disposed below the third insulating layer 16 may be limitedly increased in consideration of low resistance of the scan line. An inorganic layer, such as the third insulating layer 16, has difficulties in planarization, so that the deposition of the thick line layer below the third insulating layer 16 may cause a problem when separating the third insulating layer 16 from other insulating layers.

Therefore, in an embodiment, the second line 410 that is used as the scan line is disposed below the fourth insulating layer 19 which is an organic layer, and the first line 414 that is used as the data line is disposed below the third insulating layer 16 which is an inorganic layer. In embodiments, the second line which is a scan line is sufficiently thick to avoid defects caused by high resistance. In the illustrated embodiments, the second line may have a thickness substantially greater than that of the first line. The fourth insulating layer has a thickness to completely cover the second line and provide a planarized top surface, when the thickness of the fourth insulating is measured as a distance from a bottom surface contacting the third insulating layer to the top surface. Thus, in the illustrated embodiments, the second line may have a thickness substantially smaller than that of the fourth insulating layer. In embodiments, the second line may have a thickness substantially greater than that of the third insulating layer.

In an embodiment as shown in FIG. 2, the source and drain electrodes 218a and 218b are formed on the same layer as the first line 414 that is used as the data line, and the conductive layers 219 is formed on the same layer as the second line 410 so as to electrically connect the source and drain electrodes 218a and 218b to the active layer 212 and the pixel electrode 117.

Referring to FIG. 2, the source and drain electrodes 218a and 218b are electrically connected to the active layer 212 through holes formed in the conductive layers 219. In embodiments, the source and drain electrodes 218a and 218b are connected to regions 219a and 219b of the conductive layer region 219 through contact holes C3 and C4 that penetrate the third insulating layer 16. Here, the regions 219a and 219b of the conductive layers 219 are electrically connected to the source and drain regions 212a and 212b through contact holes C1 and C2 that penetrate the first insulating layer 13, the second insulating layer 15, and the third insulating layer 16. In addition, one of the regions 219a and 219b of the conductive layers 219 may be electrically connected to the pixel electrode 117 through a connection unit C5 that penetrates the fourth insulating layer 19, and accordingly, the pixel electrode 117 may be electrically connected to one of the source and drain electrodes 218a and 218b.

Figure 3:
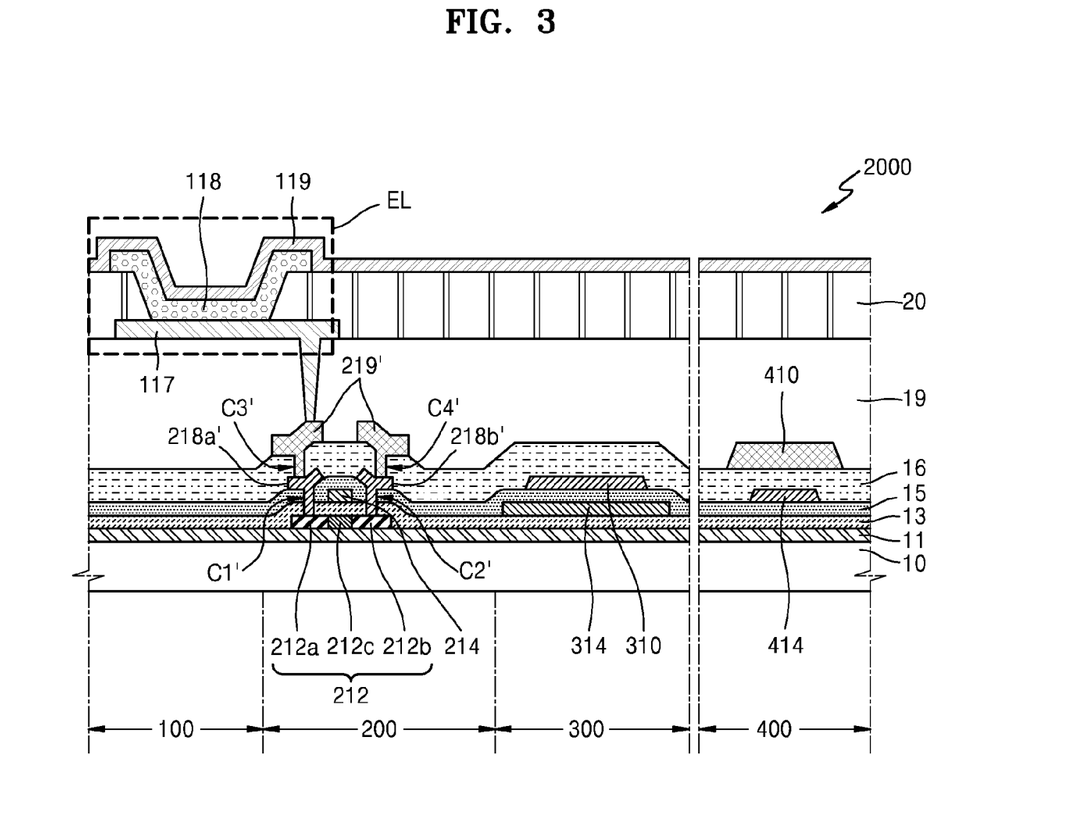
FIG. 3 is a schematic cross-sectional view showing a portion of a pixel and a line unit included in an organic light-emitting display apparatus according to another embodiment.

FIG. 3 is a schematic cross-sectional view showing a portion of a pixel and a line unit in the organic light-emitting display apparatus 2000 according to another embodiment of the present inventive concept.

According to another embodiment of the present inventive concept as shown in FIG. 3, the source and drain electrodes 218a' and 218b' are formed on the same layer as the first line 414 that is used as a data line, and a conductive layers 219' is disposed on the same layer as the second line 410 so as to electrically connect the source and drain electrodes 218a' and 218b' to the pixel electrode 117. In the illustrated embodiments, the second line may have a thickness substantially greater than that of the first line. Further, the second line may have a thickness substantially greater than that of the third insulating layer and substantially smaller than that of the fourth insulating layer.

Referring to FIG. 3, the source and drain electrodes 218a' and 218b' are electrically connected to the active layer 212 without using any other mediators. In embodiments, the source and drain electrodes 218a' and 218b' are electrically connected to the source and drain regions 212a and 212b of the active layer 212 through contact holes C1' and C2' that penetrate the first insulating layer 13 and the second insulating layer 15. The source and drain electrodes 218a' and 218b' are electrically connected to conductive layer regions 219a' and 219b' through contact holes C3' and C4' that penetrate the third insulating layer 16. In addition, one of the conductive layer regions 219a' and 219b' may be electrically connected to the pixel electrode 117 through the connection unit C5 that penetrates the fourth insulating layer 19, and accordingly, the pixel electrode 117 may be electrically connected to one of the source and drain electrodes 218a' and 218b'.

As described above, a data line for providing data signals and a scan line for providing scan signals may be disposed on different layers, and may serve as an upper line and a lower line that are arranged to at least partially overlap. Each of the lines is formed of conductive materials, and an insulating layer is disposed between the upper line and the lower line. Here, to increase the thickness of a scan line layer in terms of reducing the resistance of the scan line, the second line 410 disposed between the third insulating layer 16 and the fourth insulating layer 19 may be used as a scan line.

Hereinafter, a method of manufacturing the organic light-emitting display apparatus 1000 according to an embodiment will be described in detail in accordance with FIGS. 4A to 4J.

FIGS. 4A to 4J are cross-sectional views each showing a method of manufacturing the organic light-emitting display apparatus 1000 in sequence according to an embodiment.

Figure 4A:
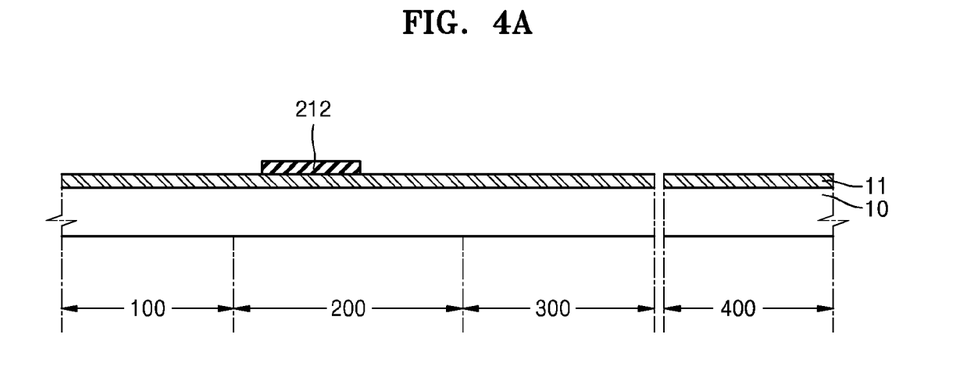
FIGS. 4A to 4J are schematic cross-sectional views sequentially showing a method of manufacturing an organic light-emitting display apparatus according to an embodiment.

First, as shown in FIG. 4A, an auxiliary layer 11 is disposed on the substrate 10.

The substrate 10 may be, in addition to a glass substrate, a transparent substrate including plastics, such as polyethylene terephthalate (PET), polyethylene naphthalate (PEN), and polyimide (PI).

Meanwhile, to minimize or reduce spread of impurity ions on a top surface of the substrate 10, to minimize or reduce infiltration of moisture or external air, and to planarize a surface of the substrate 10, the auxiliary layer 11, such as a barrier layer, a blocking layer, and/or a buffer layer, may be disposed. The auxiliary layer 11 may be formed of $SiO_2$ or $SiN_x$ in a single layer or multiple layers, and may be prepared by using various deposition methods, such as plasma enhanced chemical vapor deposition (PECVD), atmospheric pressure CVD (APCVD), and low pressure CVD (LPCVD).

Next, the active layer 212 is disposed on a TFT region 200 on the auxiliary layer 11. In detail, an amorphous silicon layer is disposed first on top of the auxiliary layer 11, and then, crystallized to form a polycrystalline silicon layer. The amorphous silicon layer may be crystallized by using various methods, such as rapid thermal annealing (RTA), solid phase crystallization (SPC), excimer laser annealing (ELA), metal induced crystallization (MIC), metal induced lateral crystallization (MILC), and sequential lateral solidification (SLS). Then, the poly crystalline silicon layer may be patterned to the active layer 212 of the thin film transistor TFT by using a mask process using a first mask.

Figure 4B:
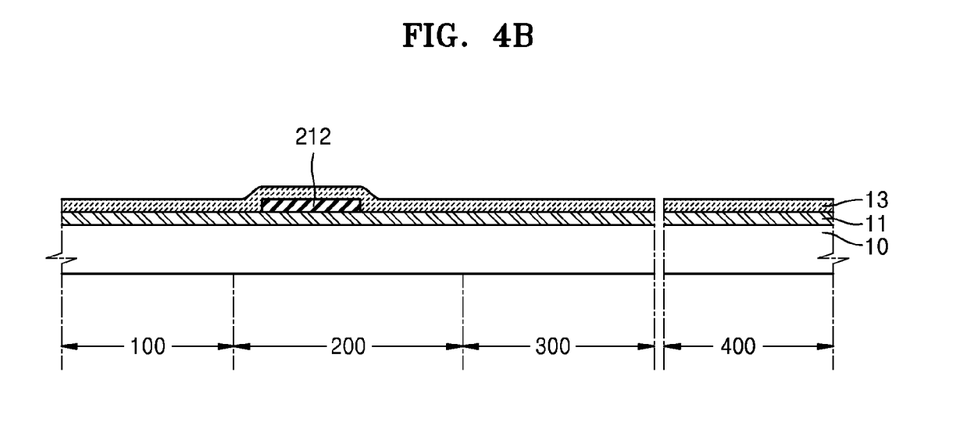

Next, as shown in FIG. 4B, the first insulating layer 13 is formed on an entire surface of the substrate 10 on which the active layer 212 is disposed. The first insulating layer 13 may be an inorganic insulating layer, such as $SiO_x$, SiON, $Al_2O_3$, $TiO_2$, $Ta_2O_5$, $HfO_2$, $ZrO_2$, BST, or PZT, that is formed in a single layer or multi-layers, by using various methods, such as PECVD, APCVD, and LPCVD. The first insulating layer 13 is disposed between the active layer 121 and the gate electrode 214 in the TFT, so as to serve as a gate insulating layer in the TFT.

In an embodiment, the first insulating layer 13 that is used as the gate insulating layer is not used as a dielectric layer of the capacitor Cst that will be described later. Thus, the first insulating layer 13 may be designed only in consideration of properties of the gate insulating layer of the TFT, without considering dielectric properties of the capacitor Cst. For example, when a silicon nitride ($SiN_x$) that is frequently used as a dielectric layer of the capacitor Cst to increase capacitance of the capacitor Cst is simultaneously used as a gate insulating layer of the thin film transistor TFT, leakage current may occur in the thin film transistor TFT. However, in an embodiment, the dielectric layer of the capacitor Cst is formed separately from the gate insulating layer of the transistor TFT. In this regard, the dielectric layer and the gate insulating layer may be selected only in consideration of properties of the capacitor Cst and the thin film transistor TFT.

Figure 4C:
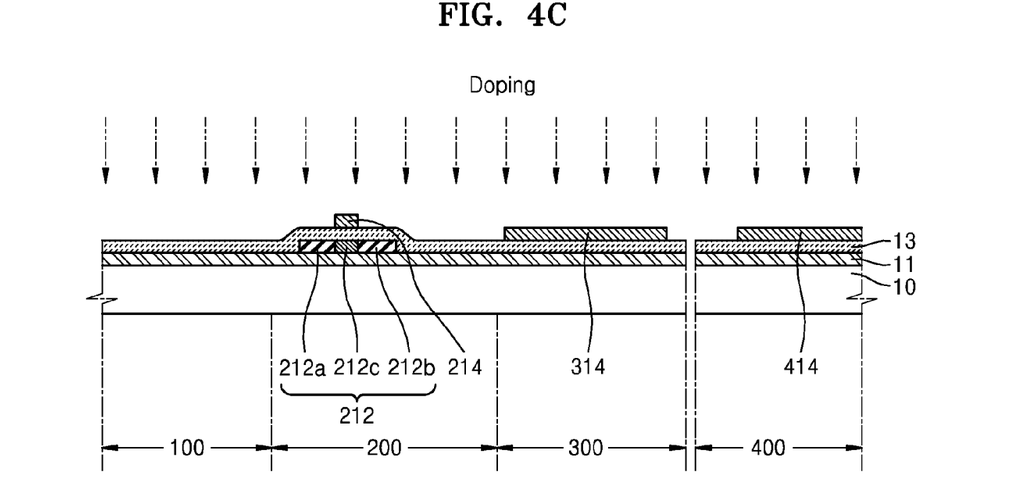

Next, as shown in FIG. 4C, a first metal layer may be stacked on the first insulating layer 13, and then, is patterned to form a gate electrode 214 of the thin film transistor TFT in the thin film transistor TFT region 200 and to form a lower electrode 314 of the capacitor Cst in the storage region 300.

The first metal layer stacked on an entire surface of the substrate 10 may be patterned according to a mask process, and for example, the first metal layer may be formed of at least one metal selected from aluminum (Al), platinum (Pt), palladium (Pd), silver (Ag), magnesium (Mg), gold (Au), nickel (Ni), neodymium (Nd), iridium (Ir), chrome (Cr), nickel (Li), calcium (Ca), molybdenum (Mo), titanium (Ti), tungsten (W), and copper (Cu), in a single layer or multiple layers.

As shown in FIG. 4C, the lower electrode 314 and the gate electrode 214 may be formed spaced apart, but an embodiment is not limited thereto. Alternatively, the lower electrode 314 and the gate electrode 214 may be integrally formed.

The gate electrode 214 may correspond to a central portion of the active layer 212, and the active layer 212 may be doped with an n-type or p-type impurity by using the gate electrode 214 as a self-aligning mask to form the source and drain regions 212a and 212b at edges of the active layer 212 corresponding to sides of the gate electrode 214, and a channel region 212c disposed between the source and drain regions 212a and 212b. Here, the impurity may include boron (B) ion or a phosphorus (P) ion.

Figure 4D:
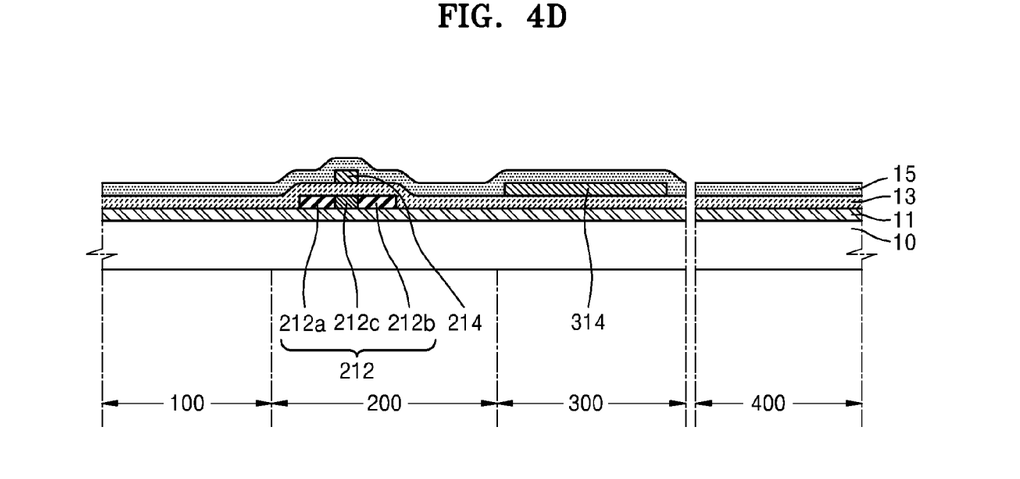

Next, as shown in FIG. 4D, the second insulating layer 15 may be disposed on the resultant structure of FIG. 4C.

The second insulating layer 15 may be formed of an inorganic insulating material selected from $SiO_2$, SiNx, SiON, $Al_2O_3$, $TiO_2$, $Ta_2O_5$, $HfO_2$, $ZrO_2$, BST, and PZT. In particular, the second insulating layer 15 may be formed of a material having a different refractive index from that of a material forming the first insulating layer 13.

Meanwhile, the second insulating layer 15 may be used as a dielectric layer. Thus, the thickness of the second insulating layer 15 may be relatively smaller than that of other insulating layers, so as not to reduce the capacitance of the capacitor Cst. In addition, the second insulating layer 15 may be formed of an insulating material having a large dielectric constant, and accordingly, the capacitance of the capacitor Cst may be increased without increasing the area of the capacitor Cst. Thus, the area of the pixel electrode 117 and the opening ratio of the organic light-emitting display apparatus 1000 may be increased.

Figure 4E:
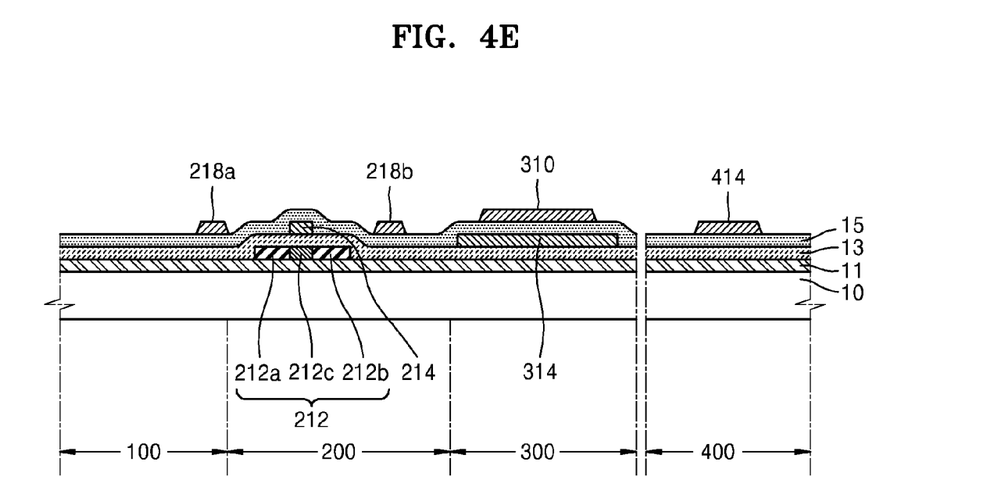

Next, as shown in FIG. 4E, a second metal layer may be stacked on the second insulating layer 15, and then, is patterned to form the source and drain electrodes 218a and 218b of the thin film transistor TFT in the thin film transistor TFT region 200, to form a upper electrode 310 of the capacitor Cst in the storage region 300, and to form a first line 414 in the line region 400.

The second metal layer 15 may be formed of a conductive material having low resistance. For example, the second metal layer 15 may be formed of at least one metal selected from Al, Pt, Pd, Ag, Mg, Au, Ni, Nd, Ir, Cr, Li, Ca, Mo, Ti, W, and Cu, in a single layer or multiple layers.

Figure 4F:
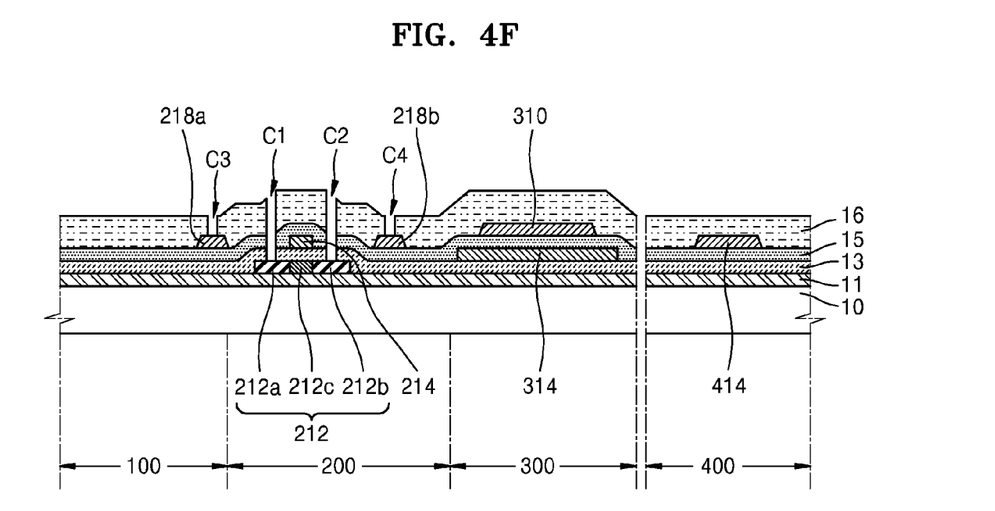

Next, as shown in FIG. 4F, the third insulating layer 16 may be disposed on the resultant structure of FIG. 4E. A first opening may be simultaneously formed in the first insulating layer 13, the second insulating layer 15, and the third insulating layer 16, so as to expose the source and drain regions 212a and 212b of the active layer 212.

The third insulating layer 16 may be formed of an inorganic insulating material selected from $SiO_2$, SiNx, SiON, $Al_2O_3$, $TiO_2$, $Ta_2O_5$, $HfO_2$, $ZrO_2$, BST, and PZT. In particular, the third insulating layer 16 may be formed of a material having a different refractive index from that of a material forming the auxiliary layer 11, the first insulating layer 13, and the second insulating layer 15. When insulating layers having a different refractive index are alternately disposed, the insulating layers may serve as a distributed brag reflector (DBR) to increase efficiency of light that is emitted from the organic emission layer. In addition, the second insulating layer 15 is formed to a thickness greater than that of the first insulating layer 13, thereby serving as an interlayer insulation film between the gate electrode 214 and the source and drain electrodes 218a and 218b.

In detail, the first insulating layer 13, the second insulating layer 15, and the third insulating layer 16 may be patterned by a masking process to form contact holes C1 and C2. Here, the contact holes C1 and C2 may be formed to expose a portion of the source and drain regions 212a and 212b of the active layer 212. In addition, the third insulating layer 16 may be further patterned to form contact holes C3 and C4. Here, the contact holes C3 and C4 may be formed to expose a portion of the source and drain electrodes 218a and 218b.

When the materials forming the first insulating layer 13, the second insulating layer 15, and the third insulating layer 16 are different from each other, the first insulating layer 13, the second insulating layer 15, and the third insulating layer 16 may be patterned by using the same masking process, but may be separately formed by etching.

Figure 4G:
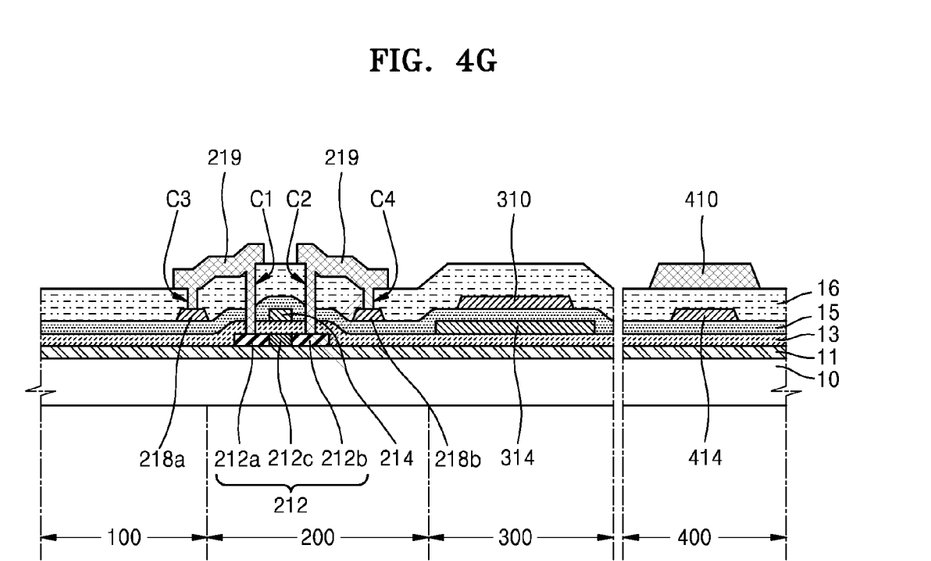

Next, as shown in FIG. 4G, a third metal layer may be disposed on the resultant structure of FIG. 4F, and third metal layer may be patterned to form the conductive layers 219 of the thin film transistor TFT in the TFT region 200 and to form the second line 410 in the line region 400.

The third metal layer may be formed of a conductive material having low resistance. For example, the third metal layer may be formed of at least one metal selected from Al, Pt, Pd, Ag, Mg, Au, Ni, Nd, Ir, Cr, Li, Ca, Mo, Ti, W, and Cu, in a single layer or multiple layers. The third metal layer fills the contact holes C1 and C2, which expose the source and drain regions 212a and 212b, and the source and drain electrodes 218a and 218b.

The third metal layer may be formed to a thickness great enough to allow the second line 410 that is used as a scan line to have low resistance. In this regard, the increase in the thickness of the second line 410 may lower the load on the scan line to facilitate driving of the high-resolution and large-sized panel.

Figure 4H:
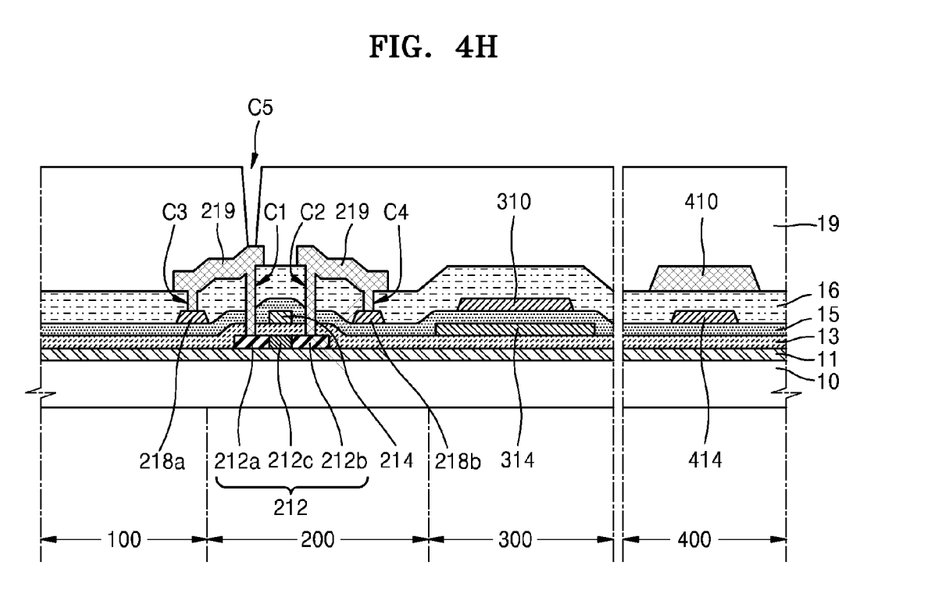

Next, as shown in FIG. 4H, the fourth insulating layer 19 may be disposed on the resultant structure of FIG. 4G, and a third contact hole or opening is formed in the fourth insulating layer 19 to expose at least a portion of the conductive layers 219.

The fourth insulating layer 19 may include a general-purpose polymer, such as polymethylmethacrylate (PMMA) and polystyrene (PS), a polymer derivative having a phenol group, an acryl-based polymer, an imide-based polymer, an arylether-based polymer, an amide-based polymer, a fluorine-based polymer, a p-xylene-based polymer, a vinylalcohol-based polymer, or a blend thereof. In embodiments, the fourth insulating layer 19 may include an organic insulating material, and may have a multi-layered structure in which the organic insulating material and the inorganic insulating material are alternately disposed.

As described above, the fourth insulating layer 19 may be formed of the organic insulating material, and accordingly, the fourth insulating layer 19 may be sufficiently planarized without considering film properties. In this regard, the thickness of the second line 410 that is disposed below the fourth insulating layer 19 may be increased.

When the thickness of the line layer that is disposed below the fourth insulating layer 19 is increased, the fourth insulating layer 19 may also have a great thickness. Accordingly, the fourth insulating layer 19 that is used as a planarization layer may be formed to have a thickness greater than that of the third insulating layer 16 used as the interlayer insulation film.

In detail, the fourth insulating layer 19 may be patterned according to a masking process, so as to form the connection unit C5. Here, the connection C5 may be formed to fill a hole which is formed in the fourth insulating layer 19 to expose at least a portion of one of the conductive layer regions 219a and 219b.

Figure 4I:
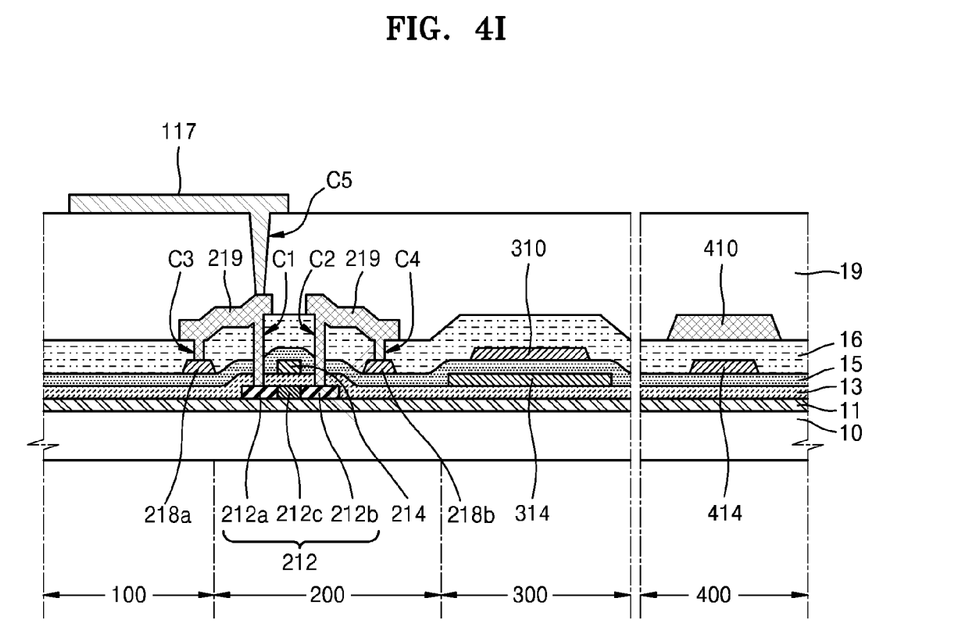

Next, as shown in FIG. 4I, a fourth metal layer may be stacked on the resultant structure of FIG. 4H, and then, may be patterned according to a masking process, so as to form the pixel electrode 117 in the emission area 100. The pixel electrode 117 may be formed to fill the connection unit C5, and accordingly, may be electrically connected to any one of the source and drain electrodes 218a and 218b via the conductive layers 219.

Figure 4J:
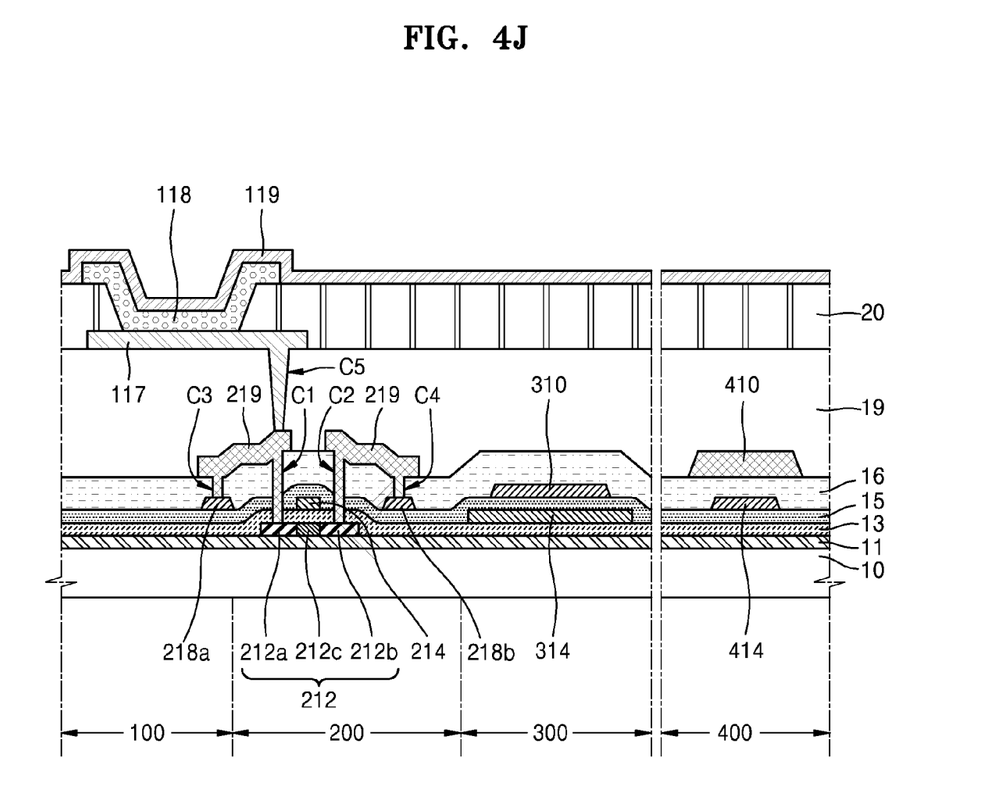

Lastly, as shown in FIG. 4J, an intermediate layer 118 including the organic emission layer may be disposed on the pixel electrode 117, and an opposite electrode 119 may be disposed facing the pixel electrode 117 and cover the intermediate layer 118.

The fifth insulating layer 20 may be further disposed on the fourth insulating layer 19. The fifth insulating layer 20 may cover the end of the pixel electrode 117 in a closed loop formation, and accordingly, may be formed on a portion of the fourth insulating layer 19.

The fifth insulating layer 20 may include an opening that exposes the central portion of the pixel electrode 117, and may be formed to cover the end of the pixel electrode 117 to reduce the influence of an electric field on the end of the pixel electrode 117. In this regard, the fifth insulating layer 20 may surround the ends of the pixel electrode 117, so as to serve as a pixel definition layer that defines the emission area 100.

The intermediate layer 118 may be formed as a single layer structure or a multiple layer structure including an organic emission layer (EML) and at least one functional layer from among a hole transport layer (HTL), a hole injection layer (HIL), an electron transport layer (ETL), and an electron injection layer (EIL). Here, the organic EML may be formed of a low molecular weight organic material or a high molecular weight organic material.

The opposite electrode 119, which is a common electrode, may be disposed on the intermediate layer 118. In the organic light-emitting display apparatus 1000 according to an embodiment, the pixel electrode 117 may be used as an anode and the opposite electrode 119 may be used as a cathode, and vice versa.

When the organic light-emitting display apparatus 1000 is a bottom emission type display apparatus, the opposite electrode 119 may be a reflecting electrode that includes a reflective material. Here, the opposite electrode 119 may be formed as a thick film and may include at least one material selected from Al, Mg, Li, Ca, LiF/Ca, and LiF/Al.

When the organic light-emitting display apparatus 1000 is a top emission type display apparatus, the opposite electrode 119 may be formed as a thin film and may include at least one material selected from Al, Mg, Li, Ca, LiF/Ca, and LiF/Al. Here, the opposite electrode 119 may be formed as a thin film having a thickness ranging from about 100 angstrom to about 300 angstrom to increase transmittance.

In another embodiment, a method of manufacturing the organic light-emitting display apparatus 2000 is described mainly based on differences in the method of manufacturing the organic light-emitting display apparatus 1000 of the previous embodiments. Reference numbers of FIG. 2 which are the same as those of FIG. 3 represent the same elements in the configuration of the previous embodiment. Since the same configuration of elements denotes the same function or performance, redundant descriptions regarding the same configuration will be omitted hereinafter.

First, a process of sequentially disposing the auxiliary layer 11, the active layer 212, the first insulating layer 13, the gate electrode 214, the lower electrode 314 of the capacitor Cst, and the second insulating layer 15 on the substrate 10 is the same as in the manufacturing method of the previous embodiments.

Next, the first insulating layer 13 and the second insulating layer 15 may be patterned according to a mask process, so as to form contact holes C1' and C2'. Here, the contact holes C1' and C2' may be formed to expose a portion of source and drain regions 212a and 212b of the active layer 212 to be formed later.

Next, a second metal layer may be disposed on the resultant structure and then be patterned according to a mask process, so as to form the source and drain regions 212a and 212b of the thin film transistor TFT in the thin film transistor TFT region 200, to form a upper electrode 310 of the capacitor Cst in the storage area 300, and to form a first line 414 in the line area 400.

Next, a third insulating layer 16 may be disposed on the resultant structure, and then, may be patterned according to a mask process, so as to form contact holes C3' and C4'. Here, the contact holes C3' and C4' may be formed to expose a portion of the source and drain electrodes 218a' and 218b'.

Next, a third metal layer may be stacked on the resultant structure, and then, may be patterned according to a mask process, so as to form conductive layers 219' of the thin film transistor TFT in the thin film transistor TFT region 200 and to form a second line 410 in the line area 400.

Subsequently, the fourth insulating layer 19, the connection C5, the pixel electrode 117, the fifth insulating layer 20, the intermediate layer 118, and the opposite electrode 119 may be sequentially formed in the same manner as in the manufacturing methods described above.

In short, compared to the organic light-emitting display apparatus 1000 according to an embodiment, the organic light-emitting display apparatus 2000 according to another embodiment may include a mask process once more to form a contact hole.

As described above, according to the one or more of the above embodiments, an organic light-emitting display apparatus may reliably implement a high-resolution and large-sized panel by reducing resistance of a line layer.

It should be understood that the embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
    a substrate;
    an active layer, a gate electrode, and source and drain electrodes formed over the substrate for providing a thin film transistor;
    a first insulating layer disposed over the substrate;
    a second insulating layer disposed over the first insulating layer;
    a third insulating layer disposed over the second insulating layer;
    a fourth insulating layer disposed over the third insulating layer;
    the active layer disposed between the substrate and the first insulating layer;
    the gate electrode disposed between the first insulating layer and the second insulating layer;
    the source and drain electrodes disposed between the second insulating layer and the third insulating layer;
    conductive layers disposed between the third insulating layer and the fourth insulating layer, the conductive layers being electrically connected to the source and drain electrodes through the third insulating layer, respectively;
    a first line disposed between the second insulating layer and the third insulating layer, the first line being formed of the same material as the source and drain electrodes;
    a second line overlapping at least a portion of the first line, the second line being disposed between the third insulating layer and the fourth insulating layer such that the second line is covered by the fourth insulating layer, wherein the second line is formed of the same material as the conductive layers; and
    an organic light-emitting diode disposed over the fourth insulating layer.

2. The organic light-emitting display apparatus of claim 1, wherein the first line is a data line that is electrically connected to one of the source and drain electrodes, and
    wherein the second line is a scan line that is electrically connected to one of the conductive layers, the second line having a thickness substantially greater than that of the first line.

3. The organic light-emitting display apparatus of claim 1, further comprising a capacitor that comprises a lower electrode disposed between the first insulating layer and the second insulating layer and a upper electrode disposed between the second insulating layer and the third insulating layer,
    wherein the second insulating layer comprises a portion disposed between the lower electrode and the upper electrode.

4. The organic light-emitting display apparatus of claim 3, further comprising a portion disposed between the active layer and the substrate.

5. The organic light-emitting display apparatus of claim 1, wherein the third insulating layer comprises at least one selected from $SiN_x$, $SiO_2$, $ZrO_2$, $TiO_2$, $Ta_2O_5$, and $Al_2O_3$.

6. The organic light-emitting display apparatus of claim 1, wherein the fourth insulating layer comprises an organic insulating material.

7. The organic light-emitting display apparatus of claim 1, wherein a thickness of the fourth insulating layer is greater than that of the third insulating layer.

8. The organic light-emitting display apparatus of claim 1, wherein the source and drain electrodes are electrically connected to the active layer via the conductive layers, respectively.

9. The organic light-emitting display apparatus of claim 8, wherein the conductive layers are electrically connected to the active layer through holes formed in the first insulating layer, the second insulating layer, and the third insulating layer, respectively.

10. The organic light-emitting display apparatus of claim 1, wherein the source and drain electrodes are electrically connected to the active layer through holes formed in the first insulating layer and the second insulating layer, respectively.

11. The organic light-emitting display apparatus of claim 1, wherein the organic light-emitting diode comprises a pixel electrode, an intermediate layer disposed over the pixel electrode and comprising an organic light emission layer, and an opposite electrode disposed over the intermediate layer.

12. The organic light-emitting display apparatus of claim 11, wherein the pixel electrode is electrically connected to one of the source and drain electrodes via one of the conductive layers.

13. A method of manufacturing an organic light-emitting display apparatus, the method comprising:
    forming a semiconductor layer over a substrate and patterning the semiconductor layer, thereby forming an active layer;
    forming a first insulating layer over the substrate and the active layer;
    forming a first metal layer over the first insulating layer and patterning the first metal layer, thereby forming a gate electrode over the first insulating layer;
    forming a second insulating layer over the first insulating layer and the gate electrode;
    forming a second metal layer over the second insulating layer and patterning the second metal layer, thereby forming a first line and source and drain electrodes;
    forming a third insulating layer over the second insulating layer, the first line and the source and drain electrodes;
    forming first holes through the first insulating layer, the second insulating layer and the third insulating layer, and second holes through the third insulating layer, wherein the first holes expose source and drain regions of the active layer, respectively, and the second holes expose the source and drain electrodes, respectively;
    forming a third metal layer over the third insulating layer and patterning the third metal layer, thereby forming a second line and conductive layers, the second line having a thickness substantially greater than that of the first line;
    forming a fourth insulating layer over the third insulating layer, the second line and the conductive layers;
    forming a third hole through the fourth insulating layer, wherein the third hole exposes at least a portion of one of the conductive layers; and
    forming a fourth metal layer over the fourth insulating layer and patterning the fourth metal layer, thereby forming a pixel electrode.

14. The method of claim 13, further comprising, after forming the gate electrode:
    doping the source and drain regions of the active layer with an ion impurity.

15. The method of claim 13, wherein a lower capacitor electrode is formed when patterning the first metal layer, and wherein an upper capacitor electrode is formed when patterning the second metal layer.

16. The method of claim 13, further comprising, after forming the pixel electrode:
    forming an intermediate layer comprising an organic light emission layer over the pixel electrode; and
    forming an opposite electrode overlapping the pixel electrode and covering the intermediate layer.

17. A method of manufacturing an organic light-emitting display apparatus, the method comprising:
    forming a semiconductor layer over a substrate and patterning the semiconductor layer, thereby forming an active layer;
    forming a first insulating layer over the substrate and the active layer;
    forming a first metal layer over the first insulating layer and patterning the first metal layer, thereby forming a gate electrode over the first insulating layer;
    forming a second insulating layer over the first insulating layer and the gate electrode;
    forming first holes through the first insulating layer and the second insulating layer, wherein the first holes exposes source and drain regions of the active layer, respectively;
    forming a second metal layer over the second insulating layer and patterning the second metal layer, thereby forming a first line and source and drain electrodes;
    forming a third insulating layer over the second insulating layer, the first line and the source and drain electrodes;
    forming second holes through the third insulating layer, wherein the second holes expose the source and drain electrodes, respectively;
    forming a third metal layer over the third insulating layer and patterning the third metal layer, thereby forming a second line and conductive layers, the second line having a thickness substantially greater than that of the first line;
    forming a fourth insulating layer over the third insulating layer, the second line and the conductive layers;
    forming a third hole through the fourth insulating layer, wherein the third hole exposes at least a portion of one of the conductive layers; and
    forming a fourth metal layer over the fourth insulating layer and patterning the fourth metal layer, thereby forming a pixel electrode.

18. The method of claim 17, further comprising, after forming the gate electrode:
    doping the source and drain regions of the active layer with an ion impurity.

19. The method of claim 17, wherein a lower capacitor electrode is formed when patterning the first metal layer, and when an upper capacitor electrode is formed when patterning the second metal layer.

20. The method of claim 17, further comprising, after forming the pixel electrode:
    forming an intermediate layer comprising an organic light emission layer over the pixel electrode; and
    forming an opposite electrode overlapping the pixel electrode and covering the intermediate layer.

* * * * *